(12) United States Patent
Chang

(10) Patent No.: US 6,928,013 B2
(45) Date of Patent: Aug. 9, 2005

(54) TIMING CONTROL METHOD FOR OPERATING SYNCHRONOUS MEMORY

(75) Inventor: Chien-Yi Chang, Hsinchu (TW)

(73) Assignee: Elite Semiconductor Memory Technology Inc., Hsinchu (TW)

(*) Notice: Subject to any disclaimer, the term of this patent is extended or adjusted under 35 U.S.C. 154(b) by 192 days.

(21) Appl. No.: 10/640,348

(22) Filed: Aug. 12, 2003

(65) Prior Publication Data

US 2005/0038952 A1 Feb. 17, 2005

(51) Int. Cl.$^7$ ................................................ G11C 8/00
(52) U.S. Cl. ........................... 365/203; 36/233; 36/191
(58) Field of Search ............................... 365/203, 233, 365/230.01, 230.06, 233.5, 191

(56) References Cited

U.S. PATENT DOCUMENTS 5,835,443 A * 11/1998 Fujita ........................... 365/233
6,480,423 B2 * 11/2002 Toda et al. ............ 365/189.01
6,483,770 B2 * 11/2002 Noh et al. .................. 365/233
6,499,111 B2 * 12/2002 Mullarkey .................. 713/401

* cited by examiner

Primary Examiner—Gene N. Auduong
(74) Attorney, Agent, or Firm—J.C. Patents

(57) ABSTRACT

A timing control method for operating a synchronous memory. The synchronous memory has a local data bus, a signal amplification bus and a global data bus. The timing control method includes manipulating the local data bus, the signal amplification bus and the global bus such that a series of operations including pre-charging the local data buses, developing signals on the amplifier buses is performed evenly within one clock cycle. Amplifying and transferring local data to global data is moved to next cycle and hid within the local data pre-charging period.

7 Claims, 8 Drawing Sheets

TIMING CONTROL METHOD FOR OPERATING SYNCHRONOUS MEMORY

BACKGROUND OF THE INVENTION

1. Field of Invention

The present invention relates to a timing control method. More particularly, the present invention relates to a timing control method for operating a synchronous memory.

2. Description of Related Art

In the past ten years or so, there has been some tremendous progress in the operating speed and capacity of memory array. Due to the multiplicity of functions, memory has become one of the principle products in the integrated circuit industry. Memory has developed from the earlier version of non-synchronous memory such as page mode, extended data output (EDO), and pulse extended data output (PEDO) to synchronous memory including synchronous dynamic random access memory (SDRAM), direct random access memory bus dynamic random access memory (direct RAMBUS DRAM), double data rate synchronous dynamic random access memory (DDR-SDRAM), and synchronous linked dynamic random access memory (SLDRAM).

FIG. 1 is a block diagram showing a first type of conventional timing system for a synchronous memory. As shown in FIG. 1, a decoder 102 decodes the system address value Xaddress into an address value Baddress, and a column select signal (CSL) corresponding to the address Baddress changes from a low level to a high level. Thereafter, a piece of local data (LD) is read out from a location in the memory array 104 corresponding to the address value Baddress. Because the signal level of the local data is relatively small (generally has a differential level of around 100 mV), the signal level of the local data must be amplified to a range between 0V and the operating voltage level. Hence, the local data read from the memory array 104 is transferred to a sense amplifier 106 via a local data bus 110. The sense amplifier 106 transforms the received local data signal level into a global data (GD), which is a signal having a range between 0V and the operating voltage level. The global data is then transferred to a register 108 via a global data bus 112 for temporary storage. The global data resides within the register 108 until the next time when the signal triggers the register 108 to output an output data DO to a synchronous memory 100 via an external bus (not shown).

The aforementioned actions are completed in three synchronous timing cycles P0, P1 and P2. FIG. 2 is a timing diagram showing the actions and timing of various signals applied to the synchronous memory in FIG. 1. As shown in FIG. 2, the $P0^{th}$ clock of the synchronous timing xclk initiates the reading of the $a^{th}$ address value Xaddress. The decoder 102 conducts a decoding operation that a column select signal (CSLa) then issues a high level signal and then the memory array 104 reads out the $a^{th}$ batch of local data (LD) from a location corresponding to the address.

A local data bus pre-charge (LDB pre-charge) signal terminal submits a low-level signal to pre-charge the local data bus 110 up to an operating voltage. In the meantime, a global data bus pre-charge (GDB pre-charge) signal terminal also submits a low-level signal to pre-charge the global data bus 112 up to the operating voltage. After pre-charging the local data bus 110 (that is, the LDB pre-charge signal changes from a low level to a high level), the $a^{th}$ batch of local data (LD) in the local data bus gradually changes from signals having a low differential to having a high differential. Similarly, after pre-charging the global data bus 112 (that is, the GDB pre-charge signal changes from a low level to a high level), the sense amplifier 106 amplifies the signal variation of the $a^{th}$ batch of local data into the $a^{th}$ batch of global data. The signal levels now range between 0V and the operating voltage. Thereafter, the sense amplifier 106 transfers the $a^{th}$ batch of global data (GD) to the global data bus 112.

Operations including the decoding of data by the decoder 102, the reading of data from the memory array 104, the pre-charging of the sense amplifier 106, the local data signal developing, the amplification of signals, and the transmission of data are all done within the $P0^{th}$ clocking cycle. In addition, the time period, between the transition of the signal 'LDB pre-charge' from a low level to a high level and the transition of the 'set' signal from a low level to a high level, which is used to form up a high-low differential for the signals in the $a^{th}$ batch of local data (LD) is also referred to as a signal developing time.

The $P1^{th}$ clocking of the synchronous timing xclk initiates the reading of the $(a+1)^{th}$ address value Xaddress followed by decoding a high level signal submitted to the column select signal (CSL a+1). Thereafter, the $(a+1)^{th}$ batch of local data (LD) is read from a location having the corresponding address. The local data bus 110 and the global data bus 112 are pre-charged. Signal level of the $(a+1)^{th}$ batch of LD is amplified to form the $(a+1)^{th}$ batch of global data (GD) and moreover the $(a+1)^{th}$ batch of GD is transmitted to the global data bus 112. In the meantime, the register 108 stores up the $a^{th}$ batch of GD (Gda as shown in FIG. 2) on the global data bus 112. In other words, the register 108 performs a data registering operation in the $P1^{th}$ clocking cycle.

Similarly, the $P2^{th}$ clocking of the synchronous timing xclk initiates the reading of the $(a+2)^{th}$ address value Xaddress followed by decoding a high level signal submitted to the column select signal (CSL a+2). Thereafter, the $(a+2)^{th}$ batch of local data (LD) is read from a location having the corresponding address. The local data bus 110 and the global data bus 112 are pre-charged. Signal level of the $(a+2)^{th}$ batch of LD is amplified to form the $(a+2)^{th}$ batch of global data (GD), and the $(a+2)^{th}$ batch of GD is transmitted to the global data bus 112. The register 108 stores up the $(a+1)^{th}$ batch of GD (Gda+1 as shown in FIG. 2) on the global data bus 112. In the meantime, the register 108 outputs the previously stored $a^{th}$ batch of GD via an external bus (not shown) connected to the synchronous memory 100 serving as the $a^{th}$ batch of output data DO (indicated by DOa in FIG. 2). In other words, the register 108 conducts a data output operation in the $P2^{th}$ clocking cycle.

FIG. 3 is a block diagram showing a second type of conventional timing system for a synchronous memory. The functions of the components shown in FIG. 3 are very similarly to the ones in FIG. 1. One major difference is that the three synchronous clocking cycles correspond in position to the devices within the synchronous memory. In other words, the operating conditions of the devices in each synchronous cycle are different. FIG. 4 is a timing diagram showing the relationship of various signals acting on the system in FIG. 3.

As shown in FIG. 4 (refer to FIG. 3), the $P0^{th}$ clocking of the synchronous timing xclk initiates the reading of the $a^{th}$ address value Xaddress. The decoder 102 conducts a decoding operation. In other words, the decoder 102 performs a decoding operation in the $P0^{th}$ clocking cycle.

The $P1^{th}$ clocking of the synchronous timing xclk initiates the reading of the $(a+1)^{th}$ address value Xaddress followed by decoding a high level signal submitted to the column select signal (CSLa). At the same time, the memory array 104 reads the $a^{th}$ batch of local data (LD) from a location having the corresponding address. The LDB pre-charge terminal issues a low-level signal so that the signal level of the local data bus 110 is pre-charged to an operating voltage. The GDB pre-charge terminal also issues a low-level signal so that the signal level of the global data bus 112 is pre-charged to the operating voltage.

After pre-charging the local data bus 110 (that is, the LDB pre-charge signal changes from a low level to a high level), the $a^{th}$ batch of local data (LD) in the local data bus gradually changes from signals having a low differential to having a high differential. Similarly, after pre-charging the global data bus 112 (that is, the GDB pre-charge signal changes from a low level to a high level), the sense amplifier 106 amplifies the signal variation of the $a^{th}$ batch of local data into the $a^{th}$ batch of global data. The signal levels now range between 0V and the operating voltage. Thereafter, the sense amplifier 106 transfers the $a^{th}$ batch of global data (GD) to the global data bus 112.

Operations including the reading of data from the memory array 104, the pre-charging of the sense amplifier 106, the local data signal developing, the amplification of signals, and the transmission of data are all done within the P1$^{th}$ clocking cycle. In addition, the time period, between the transition of the signal 'LDB pre-charge' from a low level to a high level and transition of the 'set' signal from a low level to a high level, which is used to form up a high-low differential for the signals in the $a^{th}$ batch of local data (LD) is also referred to as a signal developing time.

Similarly, the P2$^{th}$ clocking of the synchronous timing xclk initiates the reading of the $(a+2)^{th}$ address value Xaddress followed by decoding. Thereafter, the $(a+1)^{th}$ batch of local data (LD) is read from a location having the corresponding address. A high level signal is submitted from the column select signal (CSL) terminal. The local data bus 110 and the global data bus 112 are pre-charged. Signal level of the $(a+1)^{th}$ batch of LD is amplified to form the $(a+1)^{th}$ batch of global data (GD), and the $(a+1)^{th}$ batch of GD is transmitted to the global data bus 112. The register 108 stores the $a^{th}$ batch of GD on the global data bus 112 and outputs the stored $a^{th}$ batch of GD via an external bus (not shown) connected to the synchronous memory 100 serving as the $a^{th}$ batch of output data DO (indicated by DOa in FIG. 4). In other words, the register 108 conducts a data storage and output operation in the P 2$^{th}$ clocking cycle.

In brief, the sense amplifier needs to complete operations including the pre-charging of the local data bus, timing required for developing local data signals, and the transmission of global data to the global data bus within one clocking cycle. Other devices within the synchronous memory must also complete all their operations within a clocking cycle. Therefore, each device within the synchronous memory gauges each synchronous cycle smoothly so optimization of the clocking cycle is difficult. Ultimately, operating speed of the synchronous memory is constrained. In addition, the signal developing time for local data is fixed, the design margin of the local data developing also suffer operating speed, and hence trying to improve the operating speed of synchronous memory through a minimization of the signal development time is more difficult.

SUMMARY OF THE INVENTION

Accordingly, one object of the present invention is to provide a timing control method for operating a synchronous memory. The timing control method optimizes synchronization and increases the operating speed of the synchronous memory. In addition, the signal developing time of local data can be varied so that the developing time may be optimized to increase the operating speed of the synchronous memory.

To achieve these and other advantages and in accordance with the purpose of the invention as embodied and broadly described herein, the invention provides a timing control method for operating a synchronous memory. The synchronous memory includes a local data bus, a signal amplification bus, and a global data bus. The sense timing of the synchronous memory includes the steps of providing a synchronous clocking signal and executing the following operations in the $(n+1)^{th}$ synchronous timing cycle. In the local data bus pre-charging period, the local data bus is pre-charged to an initial value. Corresponding to the local data bus pre-charging period of the first pre-charging cycle, the $a^{th}$ batch of data is transferred from the signal amplification bus to the global data bus according to a global data transmission period within a first transmission cycle after the complete pre-charging of the global data bus. In a non-local data bus pre-charging period within the first pre-charging cycle, the $(a+1)^{th}$ batch of local data is transferred to the local data bus. Corresponding to the non-local data bus pre-charging period of the first pre-charging cycle, the signal amplification bus and the general data bus are pre-charged to an initial value according to a signal amplification bus pre-charging period within the second pre-charging cycle and a global data bus pre-charging period within a third pre-charging cycle after the $a^{th}$ batch of data is stored up in a register. Corresponding to the non-local data bus pre-charging period of the first pre-charging cycle, the $(a+1)^{th}$ batch of local data is transferred from the local data bus to the signal amplification bus and then the $(a+1)^{th}$ batch of local data is amplified to produce the $(a+1)^{th}$ batch of global data according to a local data transmission period within a second transmission cycle after the complete pre-charging of the signal amplification bus. Namely, the sense amplifier just needs to complete operations including the precharge of the local data bus and timing required for developing local data signals whin one clock cycle. The transmission of the global data to the global data bus is arranged to next clock cycle, and hid in the local data bus precharging time. With this arrangement, the synchronous memory is able to uniformly schedule various operations within the same synchronous cycle. Hence, synchronous cycles can be fully utilized and the signal developing time can be optimized to increase operating speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
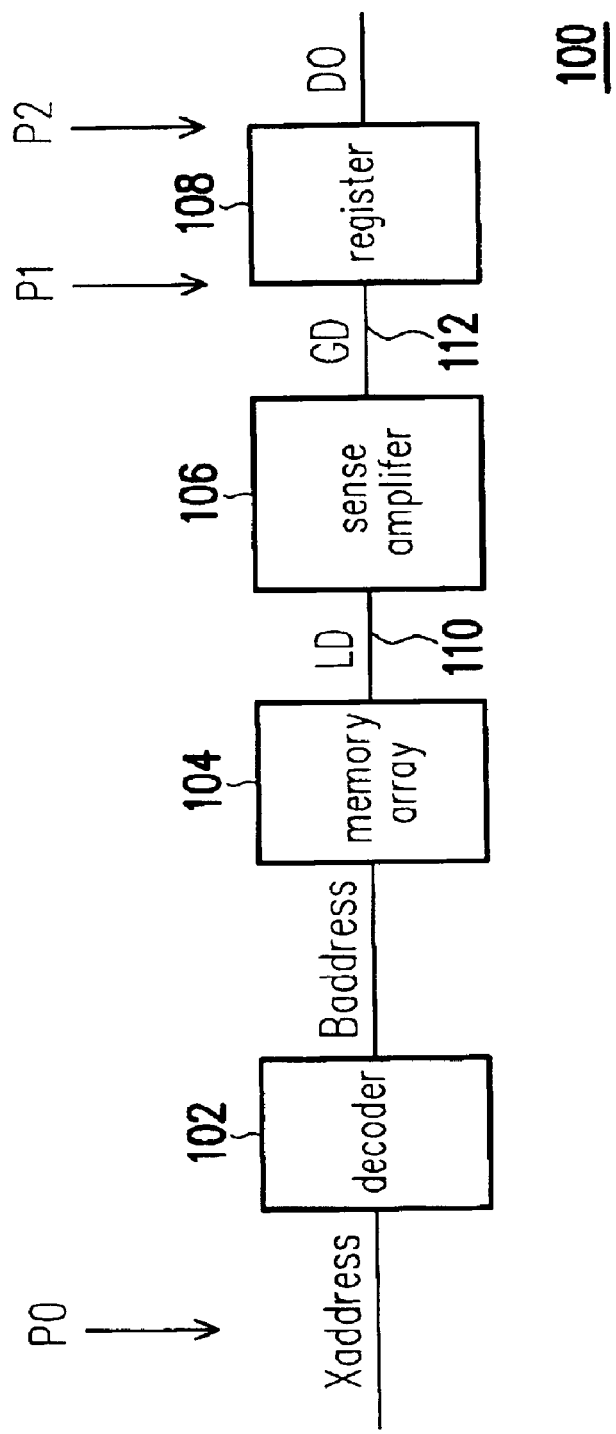
FIG. 1 is a block diagram showing a first type of conventional timing system for a synchronous memory.
Figure 2:
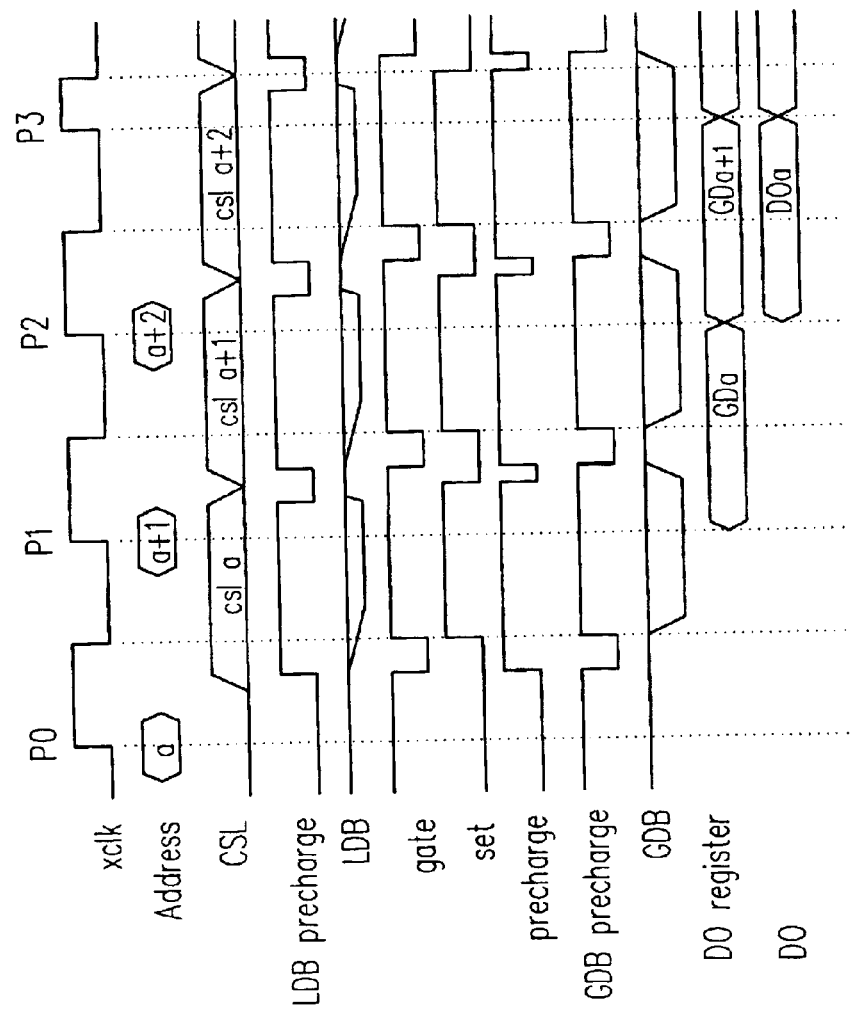
FIG. 2 is a timing diagram showing the actions and timing of various signals applied to the synchronous memory in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
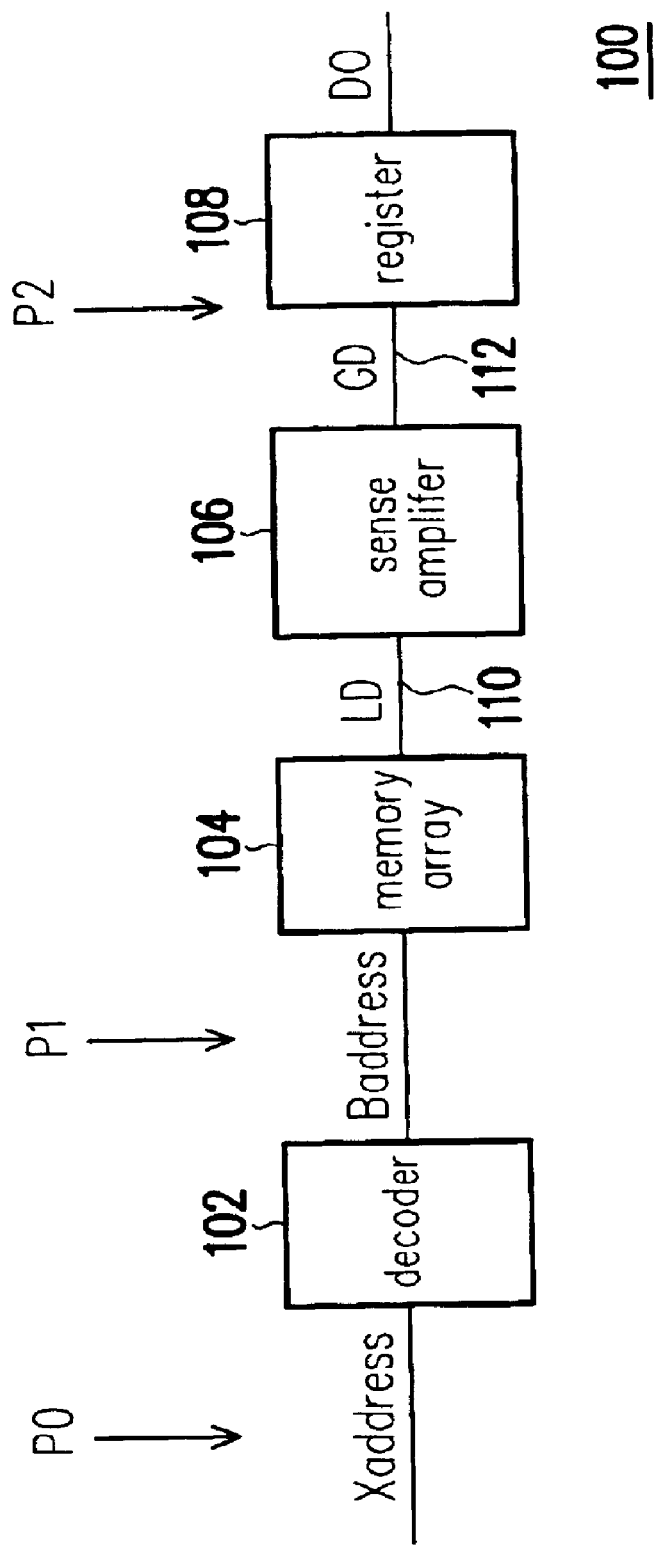
FIG. 3 is a block diagram showing a second type of conventional timing system for a synchronous memory.
Figure 4:
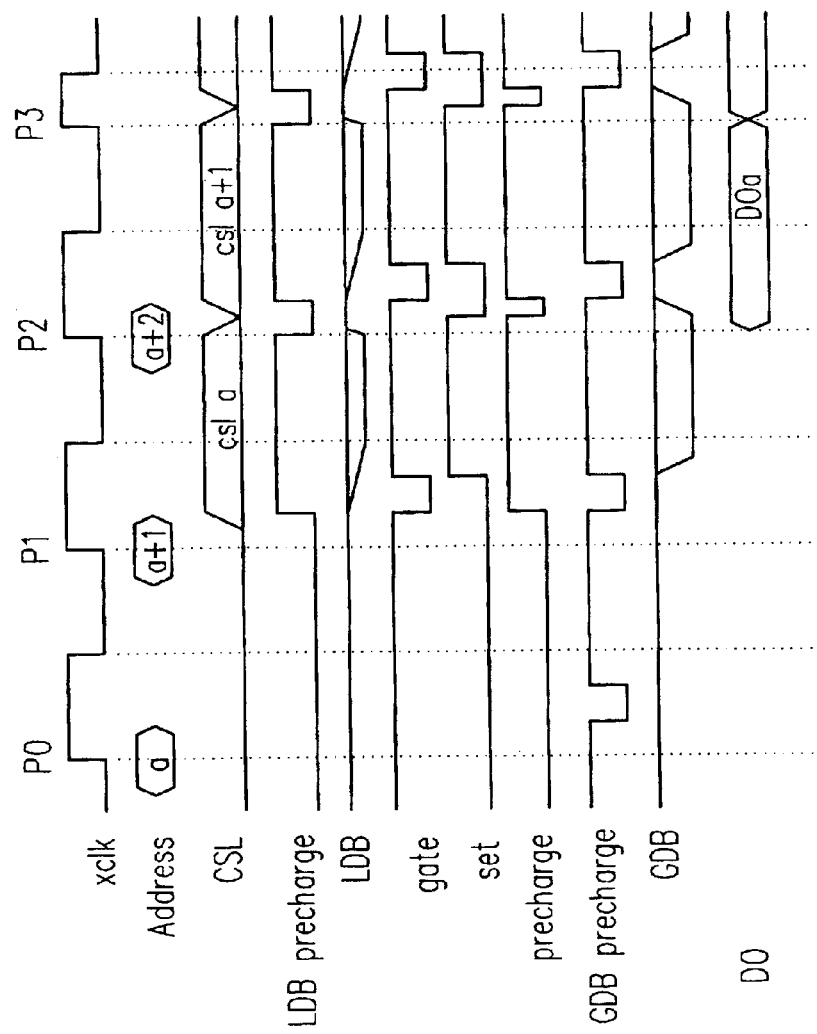
FIG. 4 is a timing diagram showing the relationship of various signals acting on the system in FIG. 3.
Figure 5:
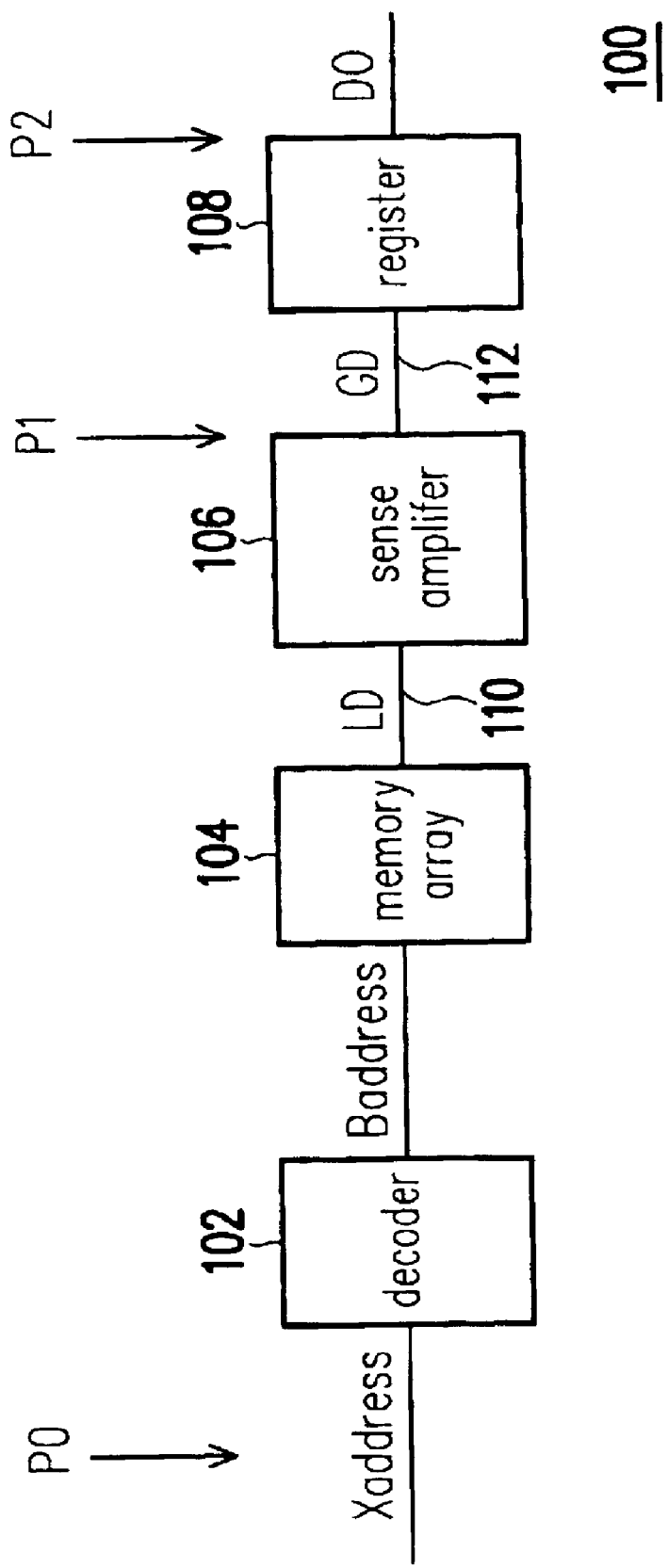
FIG. 5 is a block diagram showing a timing system for a synchronous memory according to this invention.

FIG. 5 is a block diagram showing a timing system for a synchronous memory according to a first embodiment of this invention. The timing control system in FIG. 5 has identical functions as the ones shown in FIG. 1 and FIG. 3. One major difference is that the three synchronous clocking cycles P0, P1, P2 correspond in position to the devices within the synchronous memory. In other words, the operating conditions of the devices in each synchronous cycle are different.

Figure 6:
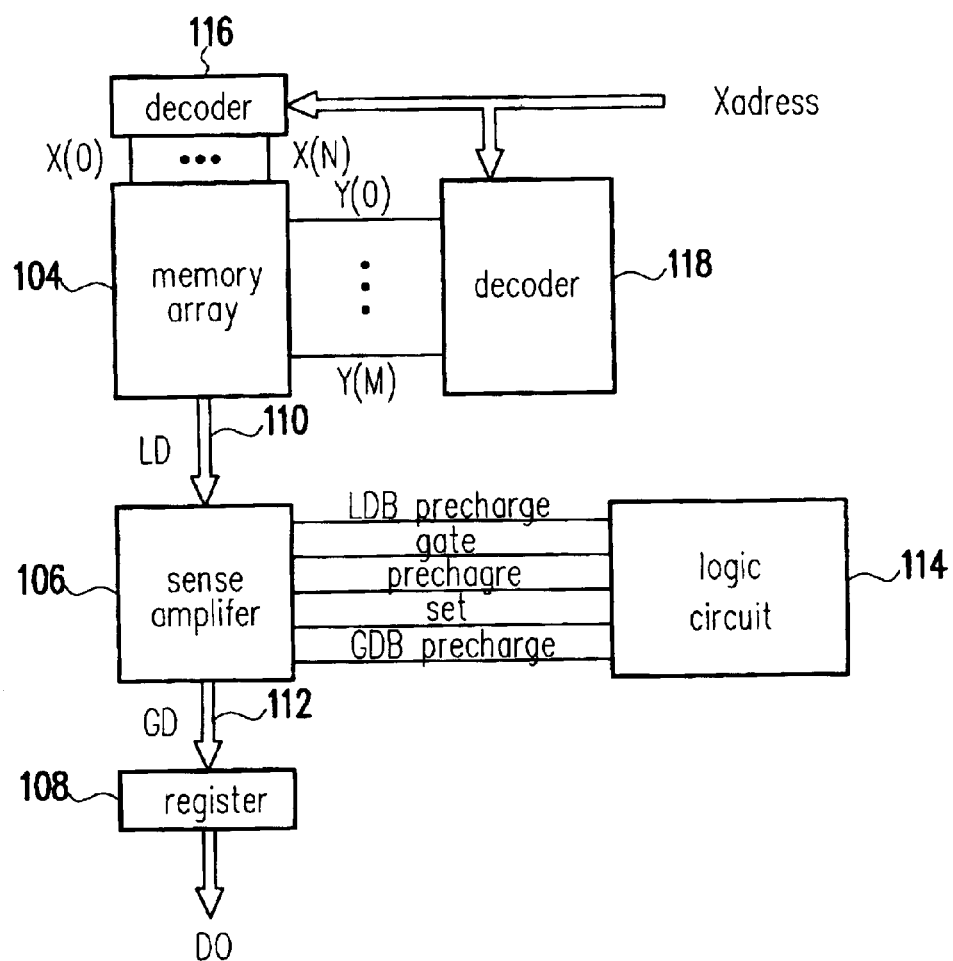
FIG. 6 is a block diagram showing an alternative timing system for a synchronous memory according to this invention.

FIG. 6 is a block diagram showing an alternative timing system for a synchronous memory according to this invention. As shown in FIG. 6, a pair of decoders 116 and 118 decodes address values Xaddress into row address values X(0)~X(N) and column address values Y(0)~Y(M) respectively. One of the column select signals CSL(0)~CSL(N×M) is selected. Local data (LD) corresponding to these column select signals CSL(0)~CSL(N×M) are read out from a memory array 104. Since the local data has a relatively small signal level (a voltage differential of only about 100 mV), the local data LD must be boosted to a greater signal level ranging between 0V and an operating voltage. Hence, the local data LD retrieved from the memory array 104 is transferred to a sense amplifier 106 via a local data bus 110. At this stage, the sense amplifier 106 transforms the local data (LD) having a relative low signal level into a global data signal level ranging between 0V and the operating voltage according to the timing signals including LDB pre-charge, gate, pre-charge, set, and GDB pre-charge submitted from a logic circuit 114. Thereafter, the global data GD is transferred to a register 108 via a global data bus 112 for temporary storage. On receiving a synchronizing signal, an output data D0 is transferred from the register 108 to an external data bus (not shown) linked to a synchronous memory 100.

Figure 7:
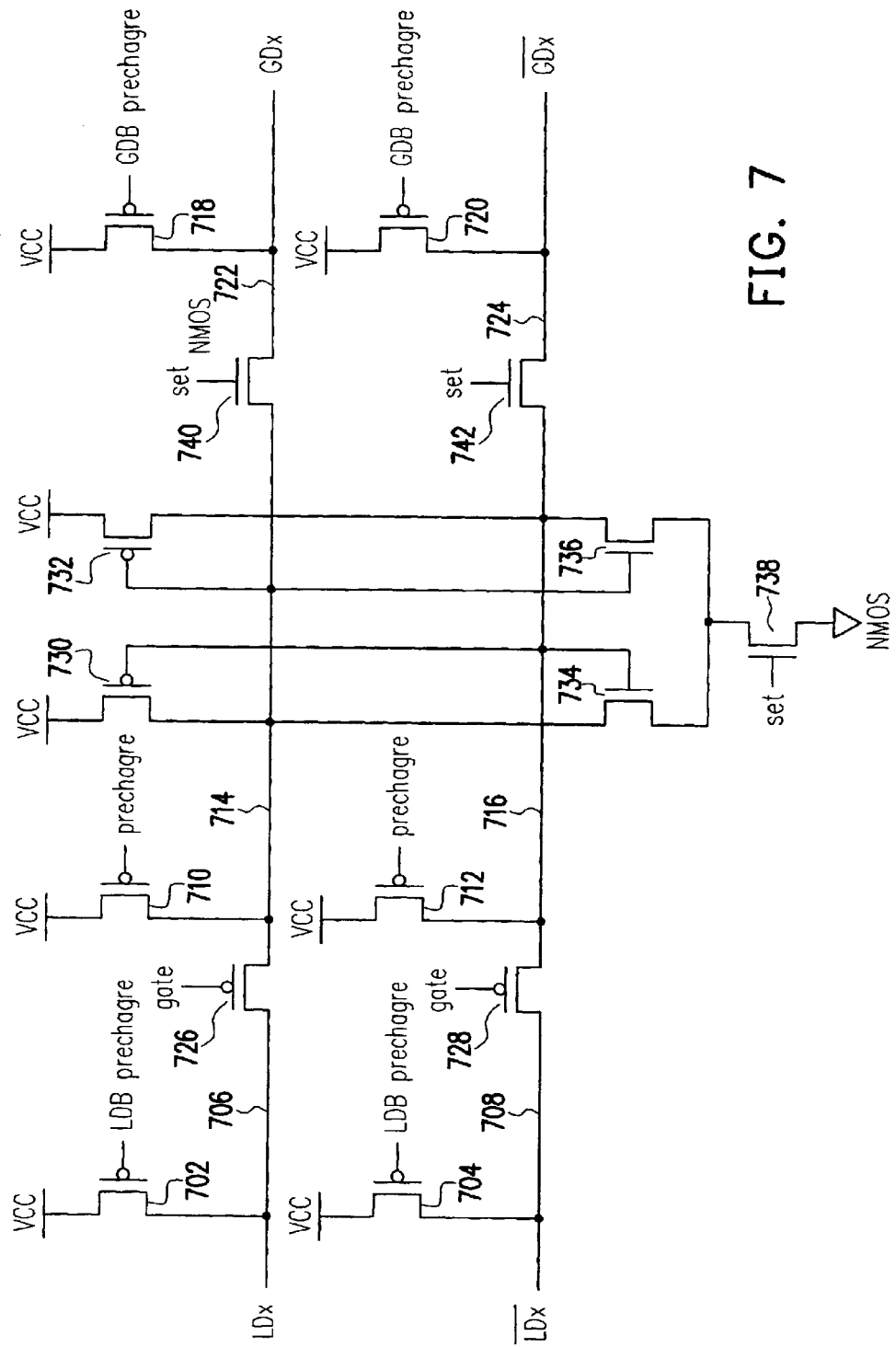
FIG. 7 is a circuit diagram of a sense amplifier according to this invention.

FIG. 7 is a circuit diagram of a sense amplifier according to this invention. The circuit shown in FIG. 7 is a portion of the sense amplifier 106 (refer to FIG. 5). The circuit in FIG. 7 only shows a single local data pair (the number of local data pairs in the local data bus 110 depends on the number of bits in the output data DO) and a single global data pair (the number of global data pairs in the global data bus 112 depends on the number of bits in the output data DO).

In FIG. 7, P-type metallic-oxide-semiconductor (PMOS) transistor 702 and PMOS transistor 704 are used for pre-charging a pair of local data buses 706 and 708 to a voltage VCC (an operating voltage). PMOS transistors 710 and PMOS transistor 712 are used for pre-charging a pair of signal amplification buses 714 and 716 to the voltage VCC. PMOS transistor 718 and PMOS transistor 720 are used for pre-charging a pair of global data buses 722 and 724 to the voltage VCC. PMOS transistor 726 and PMOS transistor 728 serve as switches for channeling local data LDx and $\overline{LDx}$ on the local data buses 706 and 708 to the signal amplification buses 714 and 716 respectively. N-type metal-oxide-semiconductor (NMOS) transistor 740 and NMOS transistor 742 also serve as switches for channeling the amplified global data GDx and $\overline{GDx}$ on the signal amplification buses 714 and 716 to the global data buses 722 and 724 respectively. PMOS transistor 730, PMOS transistor 732, NMOS transistor 734, NMOS transistor 736 and NMOS transistor 738 all serve as signal amplifiers. These signal amplifiers amplify the local data LDx and $\overline{LDx}$ with a small signal voltage level into global data GDx and $\overline{GDx}$ with the signal voltage level ranging from 0V to the voltage VCC.

Figure 8:
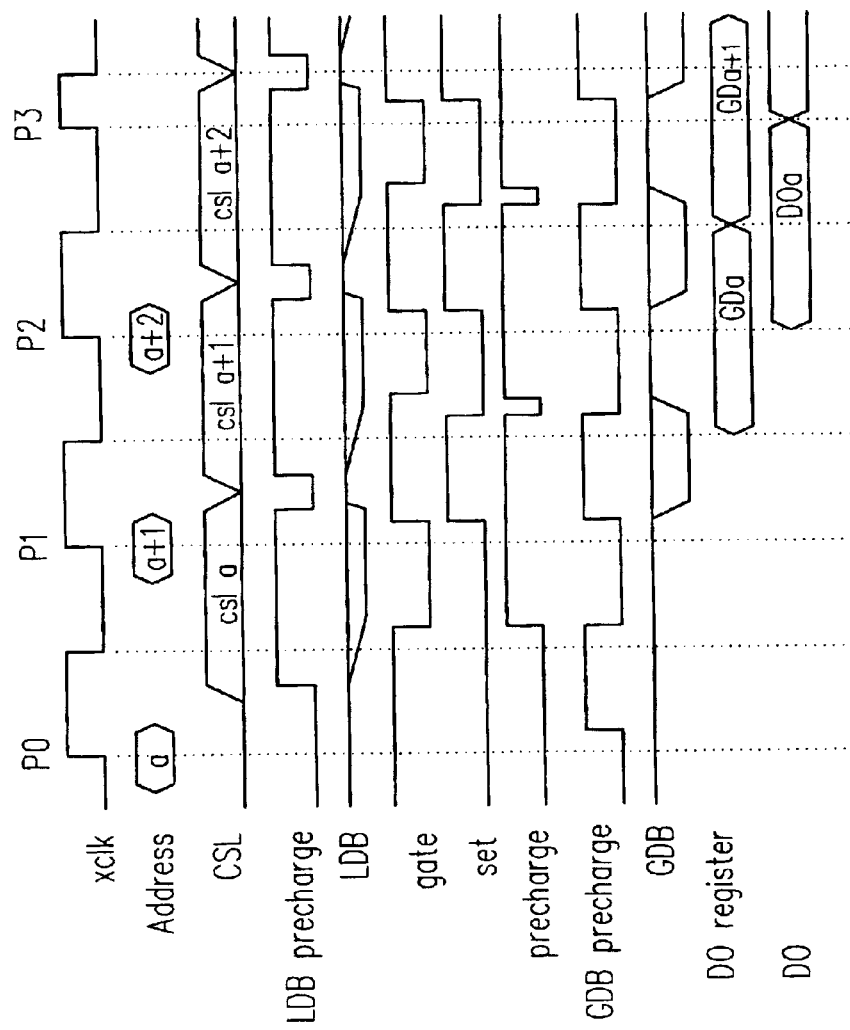
FIG. 8 is a timing diagram of the circuit shown in FIG. 7.

FIG. 8 is a timing diagram of the circuit shown in FIG. 7. As shown in FIG. 8, the $P0^{th}$ clocking of the synchronous timing xclk initiates the reading of the $a^{th}$ address value Xaddress. The decoder 102 conducts a decoding operation and then the memory array 104 reads out the $a^{th}$ batch of local data (LD) from a location corresponding to the address.

While the address value is read and decoded, the signal 'LDB pre-charge' is at a high potential level and hence the pre-charging of the pair of local data buses 706 and 708 by the PMOS transistors 702 and 704 is suspended. Similarly, the 'gate' signal is at a high potential and the 'set' signal is at a low potential; therefore, the transmission of data by the PMOS transistors 726 and 728 as well as the transmission of data by the NMOS transistors 740 and 742 are all suspended. The 'pre-charge' and 'set' signals are also at a low potential and hence the pair of signal amplification buses 714 and 716 by the PMOS transistors 710 and 712 is precharged to $V_{CC}$. On the other hand, the 'GDB pre-charge' signal is at a low potential and hence the pair of global data buses 722 and 724 is pre-charged to voltage VCC by the PMOS transistors 718 and 720.

At the end of the address value reading and decoding, the column select signal CSL(a) is selected and issued a high potential signal. In the period of the toggle and transition of the column select signals, the 'LDB pre-charge' terminal issues a low potential signal for the pair of local data buses 706 and 708 is pre-charged to the voltage VCC by the PMOS transistors 702 and 704. After pre-charging the pair of local data buses 706 and 708, the signal 'LDB pre-charge' transits from a low potential to a high potential. In the meantime, the $a^{th}$ batch of local data pair LDx and $\overline{LDx}$ sent from the memory array 104 (refer to FIG. 5) to the pair of local data buses 706 and 708 starts to develop into signals at different levels.

Thereafter, the 'gate' signal transits from a high potential to a low potential and hence the developed signals on the pair of local data buses 706 and 708 are transferred to the pair of signal amplification buses 714 and 716 by the PMOS transistors 726 and 728. At this moment, the 'set' signal is at a low potential. The period, between the transition of the 'LDB pre-charge' signal from a low level to a high level and the transition of the 'set' signal from a low level to a high level so that the $a^{th}$ batch of local data pair LDx and $\overline{LDx}$ gradually develops signal levels, is referred to as the signal development time.

In brief, operations including the decoding by the decoder 102 (refer to FIG. 5); the pre-charging of the pair of local data buses 706 and 708 by the sense amplifier 106 (refer to FIG. 5); the fetching of data from the memory array 104

(refer to FIG. 5); the development of signals of the $a^{th}$ batch of local data pair LDx and $\overline{\text{LDx}}$ on the pair of local data buses 706 and 708 into signals at different signal levels; and the transfer of the local data bus 706 and 708 to the pair of signal amplification buses 714 and 716 are all executed within the $P0^{th}$ timing cycle.

In the $P1^{th}$ cycle of the synchronizing timing xclk, the $(a+1)^{th}$ address value Xaddress is read and then decoded. The column select signal CSL(a) is issued at a low potential level and the column select signal CSL(a+1) is issued at a high potential level. In the period of the CSL toggling, the 'LDB precharge' terminal issues a low potential level to pre-charge the pair of local data buses 706 and 708. Signal development of the $(a+1)^{th}$ batch of local data pair LDx and $\overline{\text{LDx}}$ is carried out after the end of the LDB charging. At the time that the address Xaddress is read and decoded, the 'set' signal transits from a low potential to a high potential. Hence, the PMOS transistors 730 and 732, the NMOS transistors 734 and 736, and the PMOS transistor 738 amplify the $a^{th}$ batch of local data pair LDx and $\overline{\text{LDx}}$ having a small signal level difference into the $a^{th}$ batch of global data pair GDx and $\overline{\text{GDx}}$ having a signal level difference spanning from 0V to VCC volts. The NMOS transistors 740 and 742 transmit the $a^{th}$ batch of global data pair GDx and $\overline{\text{GDx}}$ from the pair of signal amplification buses 714 and 716 to the pair of global data buses 722 and 724. The register 108 (refer to FIG. 5) holds the $a^{th}$ batch of global data pair GDx and $\overline{\text{GDx}}$ on the pair of global data buses 722 and 724. Hence, the major operations conducted in the $P1^{th}$ cycle include read and decode of the $(a+1)^{th}$ address, signal development of the $(a+1)^{th}$ batch of the local data pair, the amplification and the transmission of the $a^{th}$ batch of global data pair GDx and $\overline{\text{GDx}}$ to the pair of global data buses 722 and 724 through the NMOS transistors 722 and 724, and the registration of the $a^{th}$ batch of global data pair GDx and $\overline{\text{GDx}}$ on the pair of global data buses 722 and 724 into the register 108.

Similarly, in the $P2^{th}$ cycle of the synchronous timing xclk, the $(a+2)^{th}$ address value Xaddress is read and then decoded. The $(a+2)^{th}$ batch of local data pair LDx and $\overline{\text{LDx}}$ corresponding to the address is read out. The column select signal CSL (a+1) issues a low potential level and CSL(a+2) issues a high potential level; meanwhile, pre-charge the pair of local data buses 706 and 708 and the pair of global data buses 722 and 724. Signal development of the $(a+2)^{th}$ batch of local data pair LDx and $\overline{\text{LDx}}$ is carried out. The $(a+1)^{th}$ batch of global data pair GDx and $\overline{\text{GDx}}$ is amplified and transferred to the pair of global data buses 722 and 724 and then the $(a+1)^{th}$ batch of global data pair GDx and $\overline{\text{GDx}}$ on the global data buses 722 and 724 is temporarily stored inside the register 108. The previously stored $a^{th}$ batch of global data pair GDx and $\overline{\text{GDx}}$ in the register 108 (refer to FIG. 5) is output from the data output terminal DO (refer to DOa in FIG. 5) to an external bus (not shown) that has a connection with the synchronous memory 100 (refer to FIG. 5). In other words, the register 108 outputs data in the $P2^{th}$ cycle.

In summary, operations carried out by the sense amplifier include the pre-charging of the local data buses and the provision of sufficient time for the development of local data signals within one clocking cycle. Other operations carried out by the sense amplifier include the amplification and transmission of global data to the global data buses in the next clocking cycle. Namely, the sense amplifier just needs to complete operations including the precharge of the local data bus and timing required for developing local data signals whin one clock cycle. The transmission of the global data to the global data bus is arranged to next clock cycle, and hid in the local data bus precharging time. The period, between the transition of the 'LDB precharge' signal from a low level to a high level and the transition of the 'set' signal from a low level to a high level, is referred to the signal developing time which depends on the clock cycle time. Therefore, the memory speed is self aligned on the signal development time, thus the design margin is not necessary and no speed is lost. With this timing schedule, the synchronous memory is able to complete various tasks evenly within one clocking cycle. Hence, the synchronous clocking cycles can be fully utilized and the operating speed of the synchronous memory can be improved. Furthermore, the signal developing time for the local data may be varied to shorten the operation cycle. Ultimately, the overall operating speed of the synchronous memory will increase.

Hence, one major advantage of this invention is the provision of a timing control method for operating a synchronous memory such that various operations within a clocking cycle are synchronized and hence the operating speed of the synchronous memory is increased. A second advantage of this invention is the freedom to vary the signal developing time of local data so that the developing time may be optimized to increase the operating speed of the synchronous memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A timing control method for operating a synchronous memory, wherein the synchronous memory has a local data bus, a signal amplification bus, and a global data bus, the timing control method comprising the steps of:

providing a synchronous timing such that following operations are carried out in a $(n+1)^{th}$ clock cycle of the synchronous timing;

reading and decoding the $(a+1)^{th}$ address;

pre-charging the local data bus that stores the $a^{th}$ bath of local data into an initial value in a local data bus pre-charging period;

amplifying and transferring the $a^{th}$ batch of global data from the signal amplification bus to the global data bus in a global data transmission period;

transferring the $(a+1)^{th}$ batch of local data to the local data bus in a non-local data bus pre-charging period;

pre-charging the signal amplification bus and the global data bus that stores the $a^{th}$ batch of global data into an initial value in a signal amplification bus pre-charging period after temporarily storing the $a^{th}$ batch of global data to a register; and transferring the $(a+1)^{th}$ batch of local data from the local data bus to the signal amplification bus.

2. The method of claim 1, wherein the following operations are carried out in the $n^{th}$ clock cycle of the synchronous timing:

reading out an address value;

decoding the address value; and retrieving local bus data from a location corresponding to the address provided by the decoding operation.

3. The method of claim 2, wherein the $a^{th}$ batch of local data is put on the local data bus in the non-local data bus pre-charging period after the address value is decoded, a column select is within the address value decoding termination cycle and other signals corresponding to the column select is within the address value decoding termination cycle.

4. The method of claim 1, wherein after the transfer of the $a^{th}$ batch of global data from the signal amplification bus to the global data bus, further includes storing the $a^{th}$ batch of global data in a register within the synchronous memory.

5. The method of claim 4, wherein after the transfer of the $a^{th}$ batch of global data into the register, further includes outputting the $a^{th}$ batch of global data from the register in the $(n+2)^{th}$ cycle of the synchronous timing.

6. The method of claim 1, wherein the step of putting the $(a+1)^{th}$ batch of local data on the local data bus requires a signal developing time for transforming the $(a+1)^{th}$ batch of local data into the $(a+1)^{th}$ batch of local data pair.

7. The method of claim 6, wherein length of the signal developing time is the period between the transition of the local data bus pre-charging period into the non-local data bus pre-charging period and the transition from the non-global data transmission period into the global data transmission period.

* * * * *